(12) United States Patent
Tislaric

(10) Patent No.: US 6,188,225 B1
(45) Date of Patent: Feb. 13, 2001

(54) CIRCUIT AND METHOD FOR CHECKING THE CONTACTING OF A SWITCH OR PUSHBUTTON

(75) Inventor: Darko Tislaric, Sindelfingen (DE)

(73) Assignee: DaimlerChrysler AG, Stuttgart (DE)

(*) Notice: Under 35 U.S.C. 154(b), the term of this patent shall be extended for 0 days.

(21) Appl. No.: 09/067,958

(22) Filed: Apr. 29, 1998

(30) Foreign Application Priority Data

Apr. 29, 1997 (DE) .............................. 197 18 041

(51) Int. Cl.⁷ .............................................. G01R 31/02
(52) U.S. Cl. ................................... 324/422; 340/644
(58) Field of Search .................................. 324/422, 420, 324/423, 618, 133; 340/644

(56) References Cited

U.S. PATENT DOCUMENTS

| | | | |
|---|---|---|---|
| 4,977,478 | * 12/1990 | Powell | 324/418 |
| 5,153,522 | * 10/1992 | Sano | 324/418 |
| 5,289,131 | * 2/1994 | Heidt | 324/415 |
| 5,455,733 | * 10/1995 | Waggamon | 324/415 |
| 5,506,573 | * 4/1996 | Ewing | 340/652 |
| 5,546,002 | * 8/1996 | Hickl | 324/418 |
| 5,617,078 | * 4/1997 | Durif | 340/652 |

FOREIGN PATENT DOCUMENTS

| | | |
|---|---|---|
| 238572 | 4/1988 | (JP). |
| 5-174282 | 7/1993 | (JP). |
| 6-317622 | 11/1994 | (JP). |

* cited by examiner

*Primary Examiner*—Safet Metjahic
*Assistant Examiner*—Jose M. Solis
(74) *Attorney, Agent, or Firm*—Evenson, McKeown, Edwards & Lenahan, P.L.L.C.

(57) ABSTRACT

In a circuit for checking the correct contacting of a switch or pushbutton in a d.c. circuit, the switch or pushbutton is connected alternatively with at least one input and at least one output of a controller or microprocessor, and a capacitor arrangement is connected in parallel with the switch or pushbutton. Another embodiment, a coil arrangement is provided in the lead of the switch or pushbutton. In a method for checking the correct contacting of a switch or pushbutton which is connected at least initially with the output, the signal level output through the output corresponds to the signal level at the input in the case of correct contacting and actuation of the switch or pushbutton. The switches or pushbuttons are connected at least with the input after a change in the signal level, whereupon the signal level is evaluated.

19 Claims, 3 Drawing Sheets

CIRCUIT AND METHOD FOR CHECKING THE CONTACTING OF A SWITCH OR PUSHBUTTON

BACKGROUND AND SUMMARY OF THE INVENTION

This application claims the priority of German patent document 197 18 041.8, filed Apr. 29, 1997, the disclosure of which is expressly incorporated by reference herein.

The present invention relates to a method and apparatus for testing the contacting of a switch or pushbutton in a d.c. circuit In place of power switches, it is known to use switches whose switch position is read in through a controller. Such switches are connected with an input (which may be an I/O port) of the controller. The I/O port is used only as an input, by connecting this port to the switch. It is also known to connect analog switches, for example, to an input of a controller in the form of an A/D converter. In order to determined whether all such switches of a given device have been installed and are functioning properly, it is necessary to test the switches manually. The tester is guided by interactive test programs to ensure that all the switches are checked.

Particularly in production (in the automobile industry or the electronics industry, for example), there is frequently a requirement to check finished products to determine whether all the switches have been installed in the product in accordance with a predetermined product specification.

German patent document DE 37 24 926 A1 discloses a circuit in which a switch or sensor that is open in the resting position is checked by connecting a resistance in parallel with it. On the basis of a differently-set voltage level based on the resistance ratios to other resistances connected in parallel and in series, various contacting errors and/or functional problems in the switch or sensor can be detected. In order to avoid a continuous current through this resistance, a controllable switch is wired in series with it, which is closed only when a check is to be performed.

The object of the present invention is to provide a method and apparatus which simplify checking of the correct contacting of a switch or pushbutton in a circuit supplied with direct current.

This and other objects and advantages are achieved by the testing circuit and method according to the invention for checking the correct contacting of a switch or pushbutton in a circuit supplied with direct current, which is connectable alternatively with at least one input and at least one output of a controller or microprocessor. According to the invention, a capacitor arrangement (which may be a single capacitor) is connected in parallel with the switching section of the switch or pushbutton. This capacitor arrangement prevents the flow of a direct current when the switch or pushbutton is not actuated. Therefore, no additional measures need be taken (such as disconnection by means of a controllable switch, for example) in order to avoid continuous current flow and resultant discharge of a battery of a vehicle.

With this circuit, testing the contacting, or checking whether the switch or pushbutton is in fact installed, can be performed without actuating the pushbutton or switch. It is therefore also possible to check the contacting automatically.

The switch or pushbutton can be connected for example to an I/O port. According to the invention, this port is not used simply as an input, but is switched between the input and the output in order to change the signal level for checking. (It is also possible, of course, to connect the switch or pushbutton with different ports, of which at least one is an input and at least one other is an output.) In this way, the time variation of the signal following a change in level can be evaluated. Because of the RC element, there is a delayed increase in signal level if the contacting is correct.

In one embodiment of the invention, a switch or pushbutton is designed as a two-way switch or two-way pushbutton, one ouput of which is connected directly to a fixed potential, the other being connected to the same fixed potential through the capacitor system referred to previously. With this design of the circuit, discharging of the capacitor every time the switch or pushbutton is activated is avoided. (That is, otherwise, after the switch or pushbutton has been disconnected, the capacitor would then be recharged, resulting in greater energy consumption.) This design also avoids a situation in which, when the switch or pushbutton is activated, the capacitor must first be discharged until the change in signal level can be detected by the controller. This in turn would result in a time delay.

In another embodiment of the invention a coil arrangement is provided in the lead of the switch or pushbutton. In a circuit of this type, contacting of a switch or pushbutton can be checked in the actuated state, the time variation of the signal level being evaluated after the signal level has been changed by an output of the controller or microprocessor, such signal level corresponding to the signal level in the switch or pushbutton when it is being actuated.

In an advantageous embodiment, a capacitor system is connected parallel to the lead of the switch or pushbutton. As a result, a check can be performed independently of whether the switch or pushbutton is being actuated. When the signal level changes as a result of the output of the controller or microprocessor, a certain behavior of the signal level with time is established.

In another embodiment of the invention, a circuit or pushbutton is designed as a two-way switch or two-way pushbutton, one of whose leads is connected through a coil arrangement with a certain potential and whose other lead is connected by a capacitor arrangement with the given potential. As a result, a situation can be avoided in which, when a switch or pushbutton is actuated, a declining, oscillating behavior results. Thus, a certain signal level always becomes established after a certain delay.

In still another embodiment of the invention, the input and output of the controller or microprocessor comprise an I/O port, so that the switches or pushbuttons need be connected only with a single terminal of the controller or microprocessor.

In yet another embodiment, the input and output of the controller or microprocessor can be activated in different ways and with corresponding staggering, timewise. As a consequence it is also possible, for example, to check an analog switch connected with an A/D converter.

In another embodiment the circuit or pushbutton initially is connected at least with the output, with a signal level then being output that corresponds to the signal level at the input in the case of correct contacting and actuating of the switch or pushbutton, and with the switch or pushbutton, following the change in signal level, being connected at least with the input, whereupon the signal level is evaluated. In this way, the switch or pushbutton can be tested easily. The signal level emitted from the output then depends on whether the switch or pushbutton connects the input with ground or with another potential.

In a further embodiment of the invention correct contacting is checked in a simple fashion by means of the time variation of the signal level.

Further, the behavior with time can be evaluated, with at least one characteristic point in time of the signal level being compared with a certain threshold value. In the this way, the behavior with time can be evaluated without great expense.

In the method according to the invention, one of the above circuits is used for testing the correct contacting of a switch or pushbutton, with a signal level being output during operation at a known level that can be attributed to actuation of the switch or pushbutton. Such signal level corresponds to the signal level at the input when there is correct contacting and actuation of the switch or pushbutton, and the output is then deactivated; it is then determined from the subsequent time variation of the signal level whether actuation of the switch or pushbutton has occurred. In this manner, actuation of the switch or pushbutton can advantageously be distinguished from an error situation such as grounding of the lead. The signal evaluation can then be considerably improved as far as safety is concerned.

Also, with one of the above circuits, or one of the above methods, the cost of checking can be significantly reduced.

With the method and apparatus according to the invention, switches or pushbuttons can be checked as often as desired, and at any time, without the need for manual actuation, by calling up a software test routine. The test computer is used only to start the test routines and to read out the error memory/status bits.

Other objects, advantages and novel features of the present invention will become apparent from the following detailed description of the invention when considered in conjunction with the accompanying drawings.

DETAILED DESCRIPTION OF THE DRAWINGS

Figure 1:
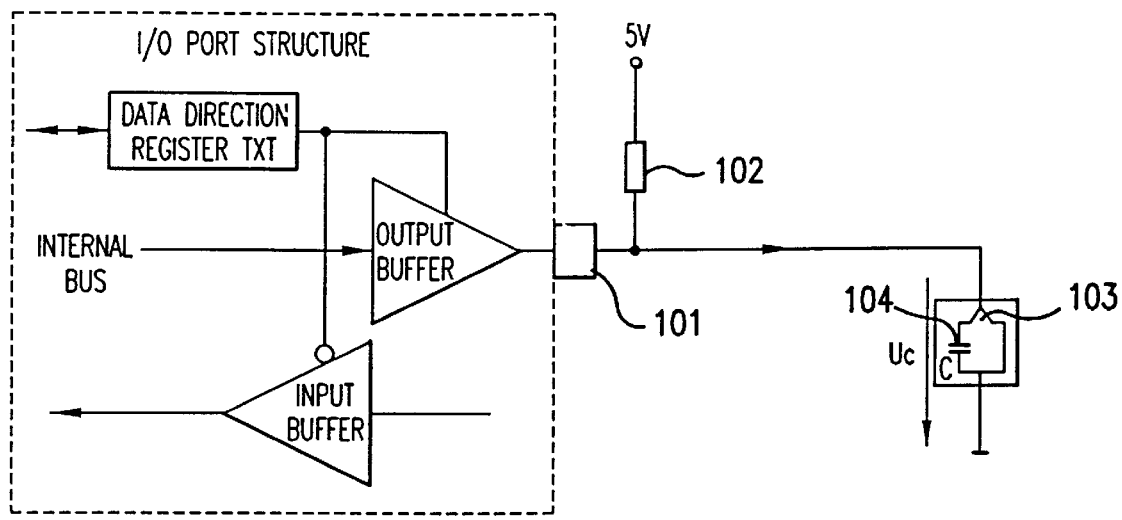
FIG. 1 is a schematic diagram of a first embodiment of the invention, with a two-way switch.

FIG. 1 is a schematic diagram which shows a controller I/O port 101, with a circuit 102 (resistance R) which is used to read the output of a two-way switch 103. One of the leads of switch 103 connects I/O port 101 directly to ground, while the other is connected to ground through a capacitor system 104 (in the embodiment in FIG. 1, a single capacitor). For the purpose of the invention, the only change that switch 103 requires by comparison with a switch according to the prior art is a capacitor 104 that is integrated with the resting state (unactuated position) of switch 103. With the high clock speed of the controller, it is possible to read in rapid loading processes at I/O port 101 so that a very small capacitor 104 is used (charge time being proportional to the magnitude of the capacitance C), which should make no difference in terms of space required for installation in switch 103. The resistor R that must be present in the push/pull and open drain output stages in order to provide a specified resting position level (5V in this case) for the input stage can be eliminated in the output stage with the collector resistance. Switch 103, of course, can be designed as a pushbutton. As a result of a design that uses a two-way switch or two-way pushbutton, the capacitor will not discharge when the switch or pushbutton is actuated (that is, when the switch is moved from its unactuated or resting position shown in FIG. 1, to its actuated position in which it is shorted to ground). As a result, energy consumption is reduced, and switching speed is increased because the switching process can be detected immediately (rather than only after the time required to discharge the capacitor has elapsed). In the unactuated state of the switch or pushbutton, the capacitor does not draw any bias current. This is very important, particularly in the automotive field in order to keep from applying an unnecessary load on the battery.

Figure 2:
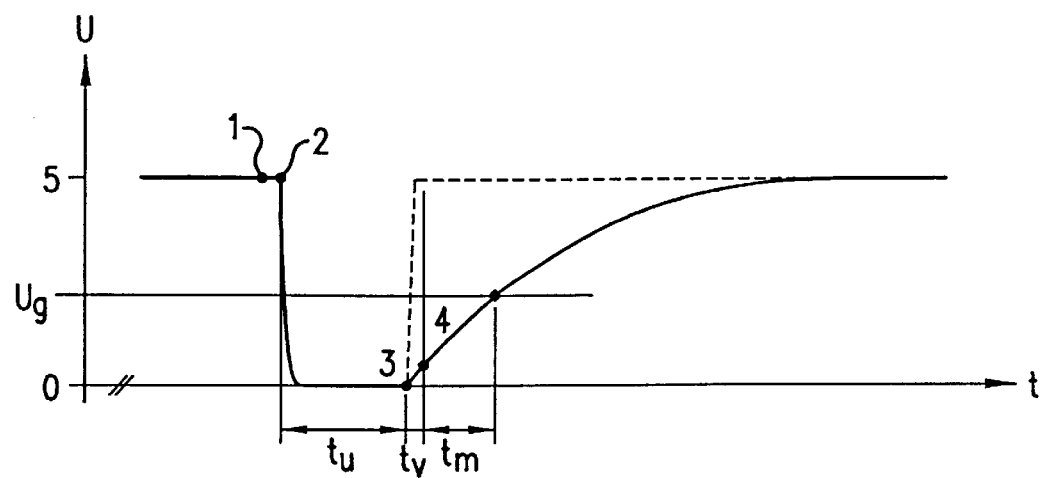
FIG. 2 is a graphic depiction of the time variation of the signal level during evaluation.

The controller must effect a change in potential at the capacitor, and then check whether such change takes place during the initial stage of the recharging process of the capacitor at the I/O port. (Without capacitor 104 or switch 103, the potential immediately returns to the starting position.) FIG. 2 shows the time curve of the signal during checking at the I/O port. Switch 103 according to FIG. 1 is in the unactuated position. A conventional switch or a switch that is not built in would show the dashed time curve.

The points marked in FIG. 2 have the following individual meanings:

first point in time at which the I/O port is read in;
 1) switch I/O port to "output", and set output to "ZERO;"
 2) switch I/O port to "input;"
 3) second point in time at which the I/O port is read in.

Operation of the circuit depicted in FIG. 1 is as follows: After switch 103 is connected (position shown in FIG. 1), current flows through resistor R into capacitor 104 and charges the latter to $U_c=5V$, whereupon capacitor 104 is blocked (fully charged) and is in its resting state. (No bias current flows.) Thereafter, when switch 103 is actuated (moved to the right hand branch in FIG. 1), capacitor 104 remains charged, since it has no opportunity to discharge. No changes in level or time delays at I/O port 101 occur during the switching actions of switch 103.

In the course of a check, as shown in FIG. 2, first I/O port 101 of switch 103 to be checked is read in (point 1), in order to determine whether a lead defect (short to ground) is present or whether the switch/pushbutton is being actuated. Since the testable switch 103 should be in the resting position before it is checked, there is a short to ground if the I/O port is read in with "low" at point 1.

The switching process at point 2 (switch from "input" to "output", and set output to "low") serves to discharge the capacitor through the I/O port. Time $T_u$ should be chosen large enough that the capacitor discharges completely, the discharge time being given by:

$$T_u \geq 5*R'*C$$

wherein R' represents contact and line resistance.

After time $T_u$ the I/O port is again connected to the input (point 3), and the capacitor begins to charge through resistor R until it once more reaches voltage Uc=5V and hence the resting time. In this case, the charging time is equal to $5*R*C$.

In order to ensure that the reading-in of I/O port 101 does not occur during the switching process of I/O port 101, delay time $t_v$ is "weighted" until I/O port 101 is read in.

The level is then compared with a threshold value $U_g$. If the level is below this threshold value, it can be concluded that a switch 103 has been installed and is properly contacted. if the level is above this threshold value it can be concluded that the time curve represented by the dashed lines is present, and therefore no switch 101 has been installed, or switch 103 is not correctly contacted. For this purpose, the I/O part must be read within the time $t_m$, since anything that is read thereafter can no longer be correctly interpreted. That is, after time $t_m$, reading in the I/O port even with the testable switch installed would result in "high", and thus offer incorrect information for evaluation as to whether the switch is installed or not. During time tm on the other hand, "low" is read in at the I/O port with the installed testable switch and if the switch is missing, "high" is read in. Thus, a lack of ambiguity is then ensured only during time $t_m$.

In the following table the possible cases of the two points in time at which the I/O port of switch 103 is read in is presented together with the knowledge to be gained therefrom.

TABLE 1

| Point 1 | Point 4 | Determination |
|---------|---------|---------------|
| "Low"   | "Low"   | Switch activated or short to ground |
| "Low"   | "High"  | Does not occur |
| "High"  | "Low"   | Switch installed |
| "High"  | "High"  | Switch not installed or short to $V_{cc}$ |

It should be noted that switches or pushbuttons that are connected to a supply of 12V rather than to ground as is switch 103 shown in FIG. 1, can be tested using the same method. Only the logic of the I/O port is reversed so that instead of discharging of the capacitor to ground, the capacitor is charged to 5V.

In complex switches with a plurality of signal leads, every lead read in from the controller must be provided with a capacitor in order to be able to check whether all the leads are present as they should be.

Figure 3:
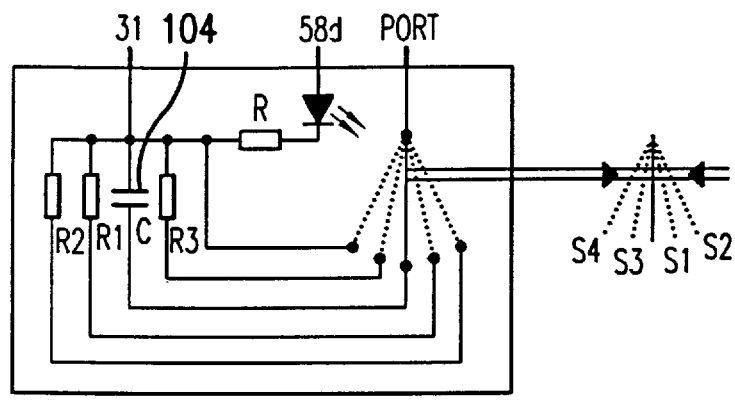
FIG. 3 shows an embodiment of an analog-coded switch.

The analog coded window lifter switch shown in FIG. 3 shows that in theory all the switches/pushbuttons could be made into testable switches or pushbuttons in this manner. That is, in its rest position the switch is connected to the capacitor 104. It can be actuated however to any one of four actuated positions associated with resistors $R_1$–$R_3$ or a direct short to the resistor R.

Since analog coded switches must be read in through a port with an A/D converter (and these usually are designed only as input ports), an I/O port must be used as well in order to permit the recharging of capacitor 104. The actual procedure of the check is then exactly as described above.

Figure 4:
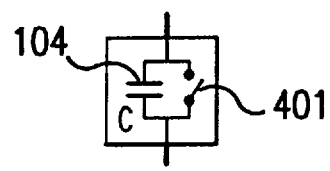
FIG. 4 shows another embodiment of a switch.

FIG. 4 shows another embodiment of a switch in which capacitor 104 can also be mounted externally on switch 401, if the time frame for producing the testable switch is too short at the moment, or the cost is no longer worthwhile because the switch is obsolescent. Advantageously, capacitor 104 is mounted on switch 401 and not in the plug of switch 401. This switch 401 has the disadvantage that manual switch operations upon the transfer to the "off" position are recognized with some delay during operation, because of capacitor 104 which discharges and then recharges with each switching process. The controller later detects the change in switch position during this recharging phase. This delay is in the ms/µs range, depending on the dimensions of capacitor 104, so that this effect is negligible, and the user does not notice it.

Figure 5:
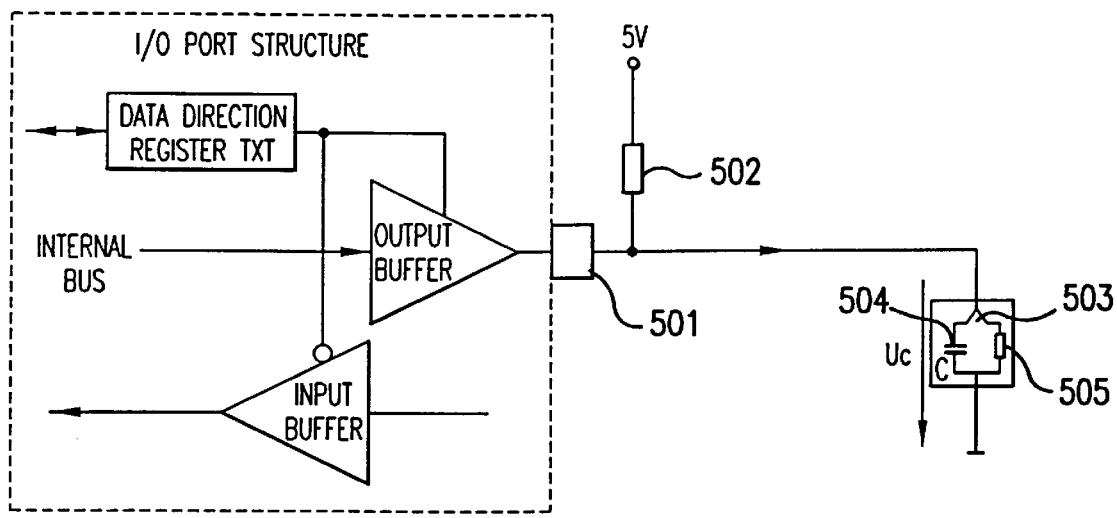
FIG. 5 shows yet another embodiment of a switch.

FIG. 5 shows yet another embodiment of a switch arrangement according to the invention. This schematic diagram shows a controller-I/O port 501 with the necessary circuit 502 (resistance R) for reading in the output of a switch 503. In addition to capacitor 504 in the lead that is integrated in the resting position (unactuated position) of the switch/pushbutton, switch 503 has a coil 505 inserted into the other lead so that it is integrated in the actuated position. The resistance R, which must be present in push/pull and open drain output stages in order to set a specific resting position level (5V in this case) for the input stages, can be eliminated in output stages with a collector resistance.

According to the invention, this switch 503 can also be tested in the actuated position by a processor/controller. A distinction can be made as to whether switch 503, which connects to ground, is closed or whether there is a short to ground and therefore the controller input is at ground potential. In the circuits according to the previous embodiments, this can be distinguished only if the switch is in the resting position before the test and the controller input is at ground potential, since only then is there a short to ground. By means of the coil, therefore, a check can also be made as to when the switch is in the "on" position or when the pushbutton is actuated.

This is useful especially in complex units such as those in the automobile or electronics industries, for example, because the switches do not have to be switched into the resting position first before the test can be started. The test, in fact, can proceed in any switch position.

Advantageously, this check can also be performed during actual operation, in order to determine whether the switch has in fact been actuated and there is not an accidental short to ground, which is especially important in the case of safety-relevant functions.

Figure 6:
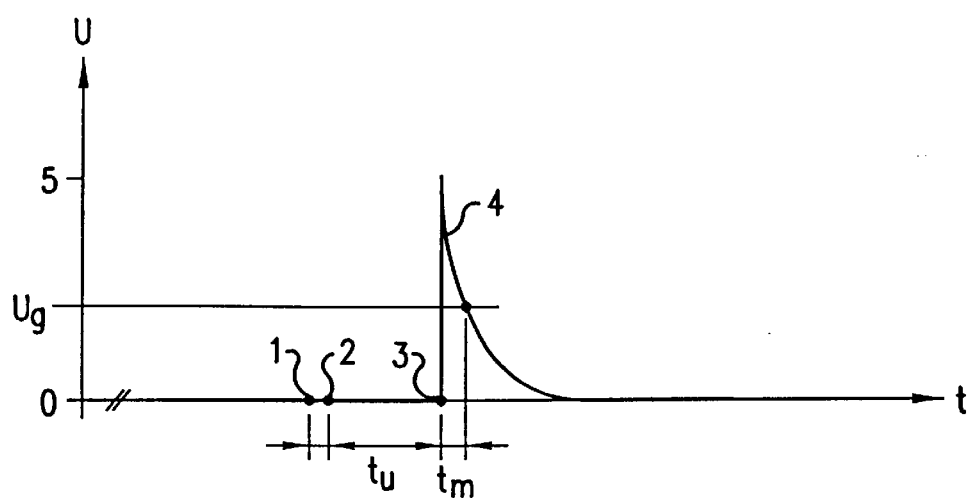
FIG. 6 is a graphic depiction of the time variation of the signal level during checking.

FIG. 6 shows the signal curve at I/O port 501 while testing switch 503 in the actuated position. With a conventional switch that is activated or with a short to ground, the dashed curve (which follows the zero value on the ordinate) would result. As a result of the potential change at the I/O port during the test, it is possible to determine whether the switch 503 is in the actuated position and therefore is operating properly, or whether there is a short to ground.

The points marked in FIG. 6 have the following meanings:

first point in time at which the I/O port is read;
  1) first point in time at which the I/O port is read;
  2) switch I/O port to "output", and set output to zero;
  3) switch I/O port to "input";
  4) second point in time at which the I/O port is read in.

In the actuated position of switch 503, current flows through coil 505 and produces a voltage drop which, because of the low line resistance of coil 505 by comparison with the much larger resistance R, is approximately zero so that in this case the controller reads "low" even with coil 505 in the steady state. In the course of the test, as shown in FIG. 6, the I/O port of switch 503 is read in first (point 1) in order to determine whether switch 503 is in the actuated position or not. The case of a short to Vcc/gnd and interruption can be ruled out in conjunction with the second read-in of the I/O port (point 4).

The switching process from point 2 (switch from "input" to "output", and setting the output of "low") ensures that the current no longer flows through coil 505 of switch 503 but through I/O port 501 of the controller. Time $t_u$ should be large enough that the magnetic field of coil 505 breaks down ($t_u \approx 5*L/R'$; wherein R' represents contact and line resistance).

Following time $t_u$ I/O port 501 is connected to the input once again (point 3). The current now attempts to flow through coil 505. Since coil 505 initially has a very high resistance, almost the entire voltage appears across coil 505 (voltage divider consisting of resistance R and the resistance of coil L of switch 503), so that the controller input sees a voltage of approximately 5V. Then the resistance of coil 505 decreases continuously so that the voltage at the controller input breaks down within a time ≈5*1L/R in correspondence with a e-function, and reaches the resting state at ≈0V.

As in FIG. 2, time $t_m$ is available to read in the I/O port, because any reading that is taken after this time $t_m$ can no longer be interpreted correctly. (After time $t_m$ reading in the I/O port would only provide the static state of the switch, since the limiting voltage $U_g$ between "high" and "low" detection is once more undershot.) During time $t_m$ on the other hand "high" is read in at I/O port 501 with switch 503 installed, and with a short to ground "low" is read in. A lack of ambiguity is assured only during time $t_m$.

In the following table, the possible cases of the two points in time at which I/O port 501 of switch 503 is read in are listed together with the information that can be gained in this way.

TABLE 2

| Point in time 1 | Point in time 4 | Determination |
| --- | --- | --- |
| "Low" | "Low" | Short to GND |
| "Low" | "High" | Switch actuated |
| "High" | "Low" | Switch installed |
| "High" | "High" | Switch not installed or short to $V_{cc}$ |

In contrast to the table above, the first two lines in Table 2 are determined unambiguously. The fourth line does not have to be distinguished to a greater degree in this case since the path of the switch is defective and the unit to be checked must be sent for repair.

A distinction must also be made as to whether the check according to FIG. 2 (test: signal level less than the threshold value) or according to FIG. 6 (test: signal level greater than the threshold value) is to be performed. This can be accomplished with the signal level being evaluated at point 1. If the signal level at this point in time is at ground, the evaluation is performed according to FIG. 6, otherwise according to FIG. 2. Similarly, the signal level could be checked at an even later point in time in order to determine whether the threshold value has been overshot or undershot. This would also permit a check.

It is apparent that the check according to FIG. 6 is possible when the switch is in the closed state. Therefore, it is possible to have a design of the switch in which a coil is inserted only in the lead, in other words that such a switch does not have a capacitor. Such a switch can then be checked only in the switched-on state.

The switch can also be checked when it is operating in order to distinguish switching of the switch from a short to ground. With a short to ground, the dashed curve of the signal level in FIG. 6 is obtained. Therefore, if the characteristic time behavior shown in FIG. 6 and described in the evaluation is detected, it may be concluded that the switch is turned on.

Figure 7:
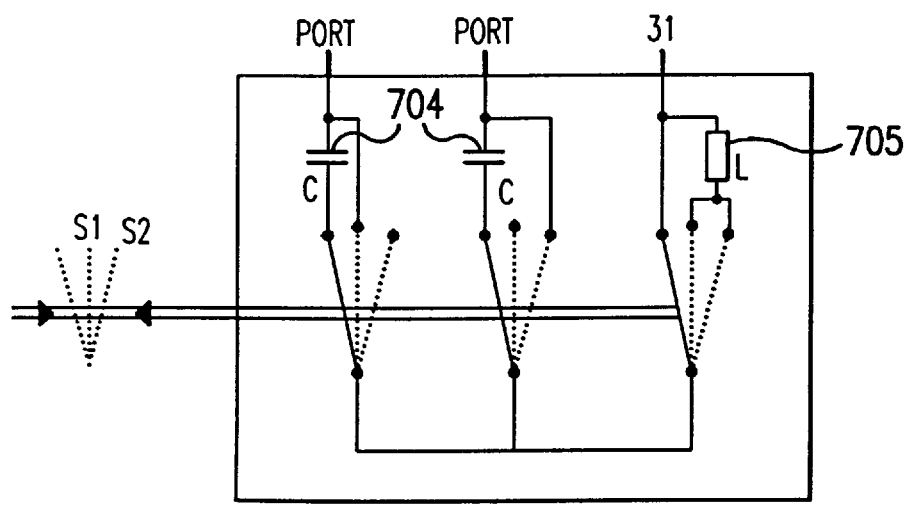
FIG. 7 shows another embodiment of a switch.

In complex switches with a plurality of signal leads, only one coil is used if the switch is designed according to FIG. 7. In this switch, each signal lead is provided with a capacitor 704 in order to be able to check, with the switch not operating, whether all the leads are properly provided. These capacitors can also be eliminated if coil 705 is present and the switch is to be checked only in the switched state. A check in both the switched-on and switched-off states is possible with the switch as shown.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A checking circuit for checking correct contacting of a switch in a d.c. circuit, comprising:
   a capacitor connected with the switch, and
   a computer connected to a terminal of said switch for temporarily switching a biasing voltage applied to said switch from a first voltage level to a second voltage level during a testing phase, measuring voltages at said terminal of said switch during predetermined time periods immediately before and after a switching of said biasing voltage, and comparing measured voltages.

2. The checking circuit according to claim 1 wherein the switch is a two-way switch, one of whose output terminals is connected directly to a fixed potential, and whose other output terminal is connected with the fixed potential through the capacitor.

3. The checking circuit according to claim 2 wherein said switch comprises a pushbutton.

4. A checking circuit for checking proper contacting of a switch in a d.c. circuit, comprising:
   a coil arranged in series with said switch; and
   a computer connected to a terminal of said switch, for temporarily switching a biasing voltage applied to said switch, from a first voltage level to a second voltage level during a testing phase, measuring voltages at a terminal of said switch during predetermined time periods immediately before and after a switching of said biasing voltage, and comparing measured voltages.

5. The checking circuit according to claim 4 further comprising a capacitor arranged in parallel with the switch.

6. The checking circuit according to claim 4 wherein said switch comprises a pushbutton.

7. The checking circuit according to claim 1 wherein the switch is a two-way switch, one of whose leads is connected by a coil arrangement with a fixed potential and whose other lead is connected with the fixed potential through the capacitor.

8. Circuit according to claim 1 wherein the computer is connected to the terminal of the switch via at least one I/O port.

9. Circuit according to claim 2 wherein the computer is connected to the terminal of the switch via at least one I/O port.

10. Circuit according to claim 7 wherein the computer is connected to the terminal of the switch via at least one I/O port.

11. Circuit according to claim 1 wherein the computer is connected to the terminal of the switch via at least one input and at least one output which are separate from each other and can be activated with a corresponding time delay.

12. Circuit according to claim 2 wherein the computer is connected to the terminal of the switch via at least one input and at least one output which are separate from each other and can be activated with a corresponding time delay.

13. Circuit according to claim 7 wherein the computer is connected to the terminal of the switch via at least one input and at least one output which are separate from each other and can be activated with a corresponding time delay.

14. Method for testing the correct contacting of a switch in a d.c. circuit, said switch being connectable alternatively with at least one output and at least one input of a computer, said method comprising:

provided a checking circuit having a capacitor arrangement connected with the switch;

connecting the switch at least initially with an output said computer;

generating a signal level at the output of the computer, said signal level corresponding to a signal level which will exist in the case of correct contacting and actuation of the switch;

changing the signal level;

following changing of the signal level, connecting the switch at least with the input of the computer; and said computer evaluating the signal level.

15. Method according to claim 14 wherein proper contacting is checked on the basis of time variation of the signal level.

16. Method according to claim 15 wherein the time variation is evaluated by comparing the signal level with a specific threshold value at at least one predetermined point in time.

17. Method for testing correct contacting of a switch in a d.c. circuit, said switch being connectable alternatively with at least one output and at least one input of a computer, said method comprising:

providing a checking circuit having a capacitor arrangement connected with the switch;

during operation of said switch at a known first signal level attributable to actuation of the switch, generating a second signal level through the output of the computer and applying said second signal level to said switch;

deactivating the output; and checking proper contact of the switch, based on time variation of the signal level.

18. The checking circuit according to claim 1 wherein said switch is a one way switch, and said capacitor is connected in parallel with said switch.

19. A circuit for checking proper operation of a switch in a d.c. circuit, comprising:

a reactive circuit element connected with said switch;

a voltage source for applying a biasing voltage to a first terminal of said switch at a first voltage level;

a microprocessor for temporarily switching the biasing voltage temporarily to a second voltage level during a testing phase;

a discharge path for discharging said reactive circuit element following a temporary switching of the biasing voltage;

wherein said computer measures voltage at said first terminal during time periods immediately before and after a switching of said biasing voltage and compares measured voltages with a predetermined voltage level.

* * * * *